(12) United States Patent
Izumi et al.

(10) Patent No.: US 7,868,964 B2
(45) Date of Patent: Jan. 11, 2011

(54) DISPLAY PANEL MANUFACTURING APPARATUS INCLUDING VACUUM CONTROLLED PANEL HOLDER AND METHOD OF USING SAME

(75) Inventors: Akinori Izumi, Taki-gun (JP); Kazuya Kaida, Nara (JP); Koji Yamabuchi, Nara (JP); Makoto Nakahara, Nara (JP); Nobuo Sasaki, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 993 days.

(21) Appl. No.: 11/661,459

(22) PCT Filed: Dec. 26, 2005

(86) PCT No.: PCT/JP2005/023792

§ 371 (c)(1),
(2), (4) Date: Feb. 23, 2007

(87) PCT Pub. No.: WO2006/075515

PCT Pub. Date: Jul. 20, 2006

(65) Prior Publication Data

US 2007/0259589 A1 Nov. 8, 2007

(30) Foreign Application Priority Data

Jan. 13, 2005 (JP) .............................. 2005-006569

(51) Int. Cl.
*G02F 1/1333* (2006.01)
*G02F 1/13* (2006.01)

(52) U.S. Cl. ............................ 349/58; 349/60; 349/158; 349/187

(58) Field of Classification Search ................. 349/158, 349/187, 58–60
See application file for complete search history.

(56) References Cited

U.S. PATENT DOCUMENTS

2004/0095526 A1 5/2004 Yamabuchi et al.
2004/0169809 A1 9/2004 Yamabuchi et al.

FOREIGN PATENT DOCUMENTS

| JP | 5-084682 | | 4/1993 |
| JP | 07065925 A | * | 3/1995 |
| JP | 11-326856 | | 11/1999 |
| JP | 2003-161935 | | 6/2003 |
| JP | 2004-004636 | | 1/2004 |

* cited by examiner

*Primary Examiner*—Julie-Huyen L Ngo
(74) *Attorney, Agent, or Firm*—Edwards Angell Palmer & Dodge LLP; David G. Conlin; David A. Tucker

(57) ABSTRACT

A liquid crystal display panel manufacturing apparatus is provided with a stage for fixing a substrate having an optical film adhered to at least one of surfaces of the substrate. The stage has a suction hole for attracting the substrate by suction. The stage has an interposition member located around a region provided with the suction hole, and the interposition member has a closed frame-like form in a plan view. A display panel manufacturing apparatus that can stably fix the substrate is provided.

8 Claims, 11 Drawing Sheets

US 7,868,964 B2

DISPLAY PANEL MANUFACTURING APPARATUS INCLUDING VACUUM CONTROLLED PANEL HOLDER AND METHOD OF USING SAME

TECHNICAL FIELD

The present invention relates a display panel manufacturing apparatus and a display panel manufacturing method, and particularly to a display panel manufacturing apparatus and a display panel manufacturing method in which a substrate is fixed to a stage by suction.

BACKGROUND ART

A liquid crystal display panel is a typical example of a display panel. As a kind of liquid crystal display panel manufacturing method, there is a multiple pattern method in which a plurality of liquid crystal display cells are formed on a large substrate, and will be cut into individual liquid crystal display cells in a later step. In a method of manufacturing a liquid crystal display panel having a small or medium size of about 5 inches, processing is first performed to form a laminated substrate including a plurality of liquid crystal display cells. The laminated substrate includes two large glass substrates adhered together by a sealing member. The large laminated substrate is divided into strip-like laminated substrates.

Then, injection of liquid crystal into the strip-like laminated substrate as well as sealing and the like are performed, and the substrate is divided into individual liquid crystal display cells. Then, an optical film is adhered to a main surface of each of the liquid crystal display cells to complete the liquid crystal display panel. The optical film includes a polarizing plate, a phase plate and the like. Adhesion of the optical film is generally performed in such a manner that the optical films are adhered to the surfaces of the individual liquid crystal display panels one by one.

In this manner, however, the optical films must be adhered to the individual liquid crystal display cells one by one, which results in low production efficiency. Even if a dedicated optical film adhering device is used for the adhesion, static electricity restricts an adhesion speed per one optical film, and therefore the adhesion speed of the optical film can be increased only to a limited extent. This results in a problem that high productivity cannot be ensured without employing a large number of optical film adhering devices for the optical film adhesion. Capital investment for the optical film adhesion significantly increases, and this increases the cost of the final product, i.e., the liquid crystal display device.

Japanese Patent Laying-Open No. 2004-4636 has disclosed a manufacturing method in which liquid crystal is supplied to a region inside a sealing member arranged annularly on one of large substrates, or is supplied to a region on the other large substrate corresponding to the inner side of the sealing member, and these substrates are adhered together. The laminated substrate thus formed includes a plurality of liquid crystal display cells. Large optical films are adhered to the whole laminated substrate, and then the laminated substrate is cut into individual liquid crystal display cells. An apparatus for adhering the large optical film to the laminated substrate is disclosed, e.g., in Japanese Patent Laying-Open No. 2003-161935.

FIG. 18 is a schematic plan of a laminated substrate including a plurality of liquid crystal display cells, and FIG. 19 is a schematic cross section thereof The laminated substrate shown in FIGS. 18 and 19 is provided with 280 liquid crystal display cells in 20 rows and 14 columns. A laminated substrate 34 includes two glass substrates opposed and adhered to each other. An optical film 32 is adhered to each of main surfaces of laminated substrate 34. Laminated substrate 34 includes a plurality of liquid crystal display cells 33. Each of liquid crystal display cells 33 has substantially a rectangular form in a plan view, and is arranged regularly with respect to the others. Liquid crystal display cells 33 are spaced from each other. Each optical film 32 covers all liquid crystal display cells 33 formed at laminated substrate 34.

In a step of dividing the laminated substrate provided with the plurality of liquid crystal display cells into individual liquid crystal display cells, belt-like portions are removed from optical film 32 to expose belt-like regions of the glass substrate as shown in FIG. 20. A film-removed portion 39 represents a portion from which optical film 32 is partially removed. Film-removed portion 39 is formed between the liquid crystal display cells formed at laminated substrate 34. Optical films 32 each having a form corresponding to the liquid crystal display cell are formed.

Then, cracks for division are formed at film-removed portion 39 by a wheel cutter used for glass scribe. Finally, laminated substrate 31 is divided along the cracks thus formed into the individual liquid crystal display cells. The individual liquid crystal display cells thus divided are connected to an external drive device or the like, and are arranged in a casing to complete a liquid crystal display device.

As shown in FIG. 19, some kinds of liquid crystal display panels have such a structure that optical films are adhered to opposite sides of the substrate, respectively. For example, in a transparent type of liquid crystal display panel, optical films are adhered to surfaces on opposite sides of the laminated substrate, respectively.

In a dividing device, the optical film are cut and removed from portions of the laminated substrate located around the liquid crystal display cells, then cracks for division are formed at the film-removed portion and the laminated substrate is divided into the individual liquid crystal display cells. In this dividing device, the laminated substrate is fixed to a stage, the optical film is partially removed with a cutter and the cracks for division are formed at the film-removed portion with a wheel cutter. For example, at the laminated substrate shown in FIG. 20, film-removed portion 39 is formed, and the cracks for division are formed at film-removed portion 39.

When processing of removing the optical film and forming the cracks is to be effected on the laminated substrate having the optical films adhered to the opposite surfaces of the substrates, respectively, the laminated substrate is first fixed to the stage of the dividing device.

FIG. 21 is a schematic cross section showing a state where the laminated substrate is fixed to the stage of the dividing device, and FIG. 22 is a schematic plan thereof. Laminated substrate 31 shown in FIGS. 21 and 22 is provided with the liquid crystal display cells of 20 in total number arranged in 4 rows and 5 columns. The dividing device is configured to fix laminated substrate 31 to a stage 43 by suction.

Stage 43 is provided with a plurality of suction holes 8, which are connected to an evacuation device. Stage 43 has a substantially rectangular form in a plan view. Laminated substrate 31 is arranged substantially on a center of stage 43. Stage 43 has suction grooves 9 that are formed at the surface of stage 43 for communication with suction holes 8. Suction grooves 9 have a grid-like from in the plan view. Suction holes 8 are arranged with certain spaced therebetween. Suction grooves 9 are formed at crossing portions of the grid-like grooves 9, respectively.

Patent Document 1: Japanese Patent Laying-Open No. 2004-4636

Patent Document 2: Japanese Patent Laying-Open No. 2003-161935

DISCLOSURE OF THE INVENTION

Problems to be Solved by the Invention

Referring to FIGS. 21 and 22, the evacuation device performs the suction in a direction of arrows 51. This dividing device is configured such that stage 43 attracts an optical film 32a formed at the surface of laminated substrate 31, and thereby laminated substrate 31 is fixed to stage 43.

One of the optical films that are adhered to the opposite surfaces of laminated substrate 31, respectively, i.e., optical film 32a is provided with film-removed portion 39, from which the optical film is removed. Cracks 42 are formed at the surface of laminated substrate 31 neighboring to optical film 32a. In the processing of partially removing optical film 32b and then forming the cracks for division at film-removed portion 39, it is necessary to attract optical film 32a defining film-removed portion 39 onto stage 43.

However, film-removed portion 39 is communicated with suction grooves 9 so that an air flows into suction holes 8 through film-removed portion 39 and attraction grooves 9. This results in a problem that laminated substrate 31 cannot be sufficiently fixed by suction. More specifically, an external air flows into suction holes 8 as indicated by arrows 53 so that laminated substrate 31 cannot be sufficiently fixed by suction. This problem occurs not only in the manufacturing of the liquid crystal display panel but also in the manufacturing of an organic EL display panel having an optical film on a main surface.

Means for Solving the Problems

An object of the invention is to provide a display panel manufacturing apparatus and a display panel manufacturing method that can stably fix a substrate.

A display panel manufacturing apparatus according to the invention includes a stage for fixing a substrate having an optical film adhered to at least one of surfaces of the substrate. The stage has a suction hole for attracting the substrate by suction, and has a projection around a region provided with the suction hole. The projection has a closed frame-like form in a plan view. Employment of this structure can provide the display panel manufacturing apparatus that can stably fix the substrate.

Preferably, in the above invention, the projection has a flat surface, and the surface of the projection is parallel to a surface of the stage. The projection has a height that allows the surface of said projection to closely contact with the surface of the substrate when the substrate is attracted by suction to bring the surface of the optical film into close contact with the surface of the stage. By employing this structure, it is possible to prevent curvature of the substrate in the fixed state, and it is also possible to increase an area of contact between the surfaces of the projection and the substrate so that the substrate can be fixed by suction to the stage more stably.

Preferably, in the above invention, the stage includes a plate member, and the projection has an interposition member to be held between the plate member and the substrate. By employing of this structure, the structure of the projection can be changed, and can be easily applied to various kinds of substrates.

Preferably, in the invention, the display panel manufacturing apparatus includes an elastic packing. The packing is held between the stage and the substrate. The packing is arranged along the projection and around a region provided with the suction hole. The packing in an unloaded state has a top located above the surface of the projection, and deforms to locate the top at the same height as the surface of the projection when the substrate is attracted by suction. By employing this structure, the projection and the packing can provide a sealing structure so that the substrate can be fixed by suction more firmly.

Preferably, in the above invention, the display panel manufacturing apparatus includes an elastic packing, the projection has a concavity formed at a surface on a side to be in contact with the substrate. The packing is arranged in the concavity. The packing in an unloaded state has a top located above the surface of the projection provided with the concavity, and deforms to locate the top at the same height as the surface of the projection when the substrate is attracted by suction. By employing this structure, the projection and the packing can provide a sealing structure so that the substrate can be fixed by suction more firmly.

A display panel manufacturing method according to the invention includes the steps of arranging an optical film to oppose to a stage; and attracting the substrate by suction via a suction hole to form a closed space by bringing a surface of a projection into close contact with a surface of the substrate, and attracting the surface of the optical film to a surface of the stage by suction. By employing this method, the substrate can be stably fixed so that the substrate can be accurately processed.

Effects of the Invention

The invention can provide the display panel manufacturing apparatus and the display panel manufacturing method that can stably fix the substrate.

DESCRIPTION OF THE REFERENCE SIGNS 3-6, 43 stage, 8 suction hole, 9 suction groove, 10-13 interposition member, 15, 16 packing, 17 plate member, 19 blade, 20 recess, 21, 22 concavity, 23 wheel cutter, 31, 34 laminated substrate, 32, 32a, 32b, 35, 36 optical film, 33 liquid crystal display cell, 39 film-removed portion, 42 crack, 51-53 arrow

BEST MODES FOR CARRYING OUT THE INVENTION

First Embodiment

Referring to FIGS. 1 to 8 and 18 to 20, an apparatus and a method of manufacturing a liquid crystal display panel which is an example of a display panel will now be described as a first embodiment of the invention.

An apparatus of manufacturing a liquid crystal display panel of the embodiment is a dividing device which operates as follows in a step of dividing a laminated substrate into individual liquid crystal display panels. Thus, the apparatus operates to cut and remove partially an optical film arranged on a substrate surface, then forms cracks for division at a film-removed portion and divides the substrate into individual liquid crystal display cells.

Figure 18:
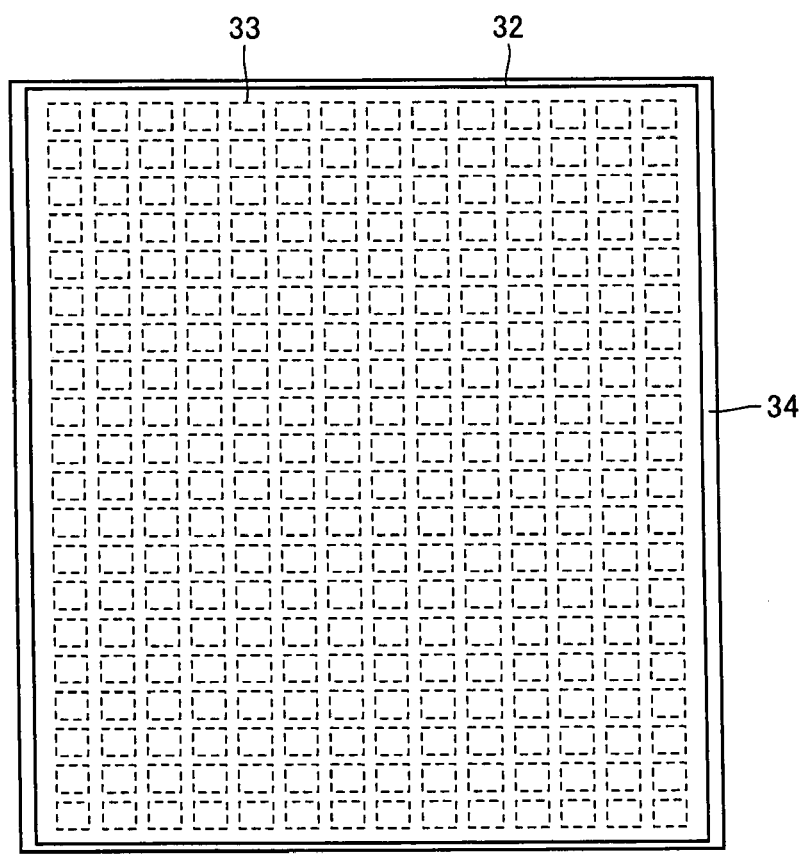
FIG. 18 is a schematic plan showing the optical film adhered to the laminated substrate.
Figure 19:
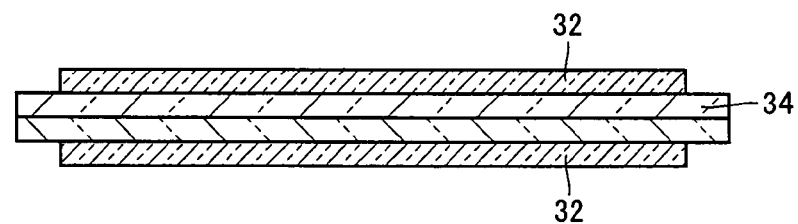
FIG. 19 is a schematic cross section showing the optical film adhered to the laminated substrate.
Figure 20:
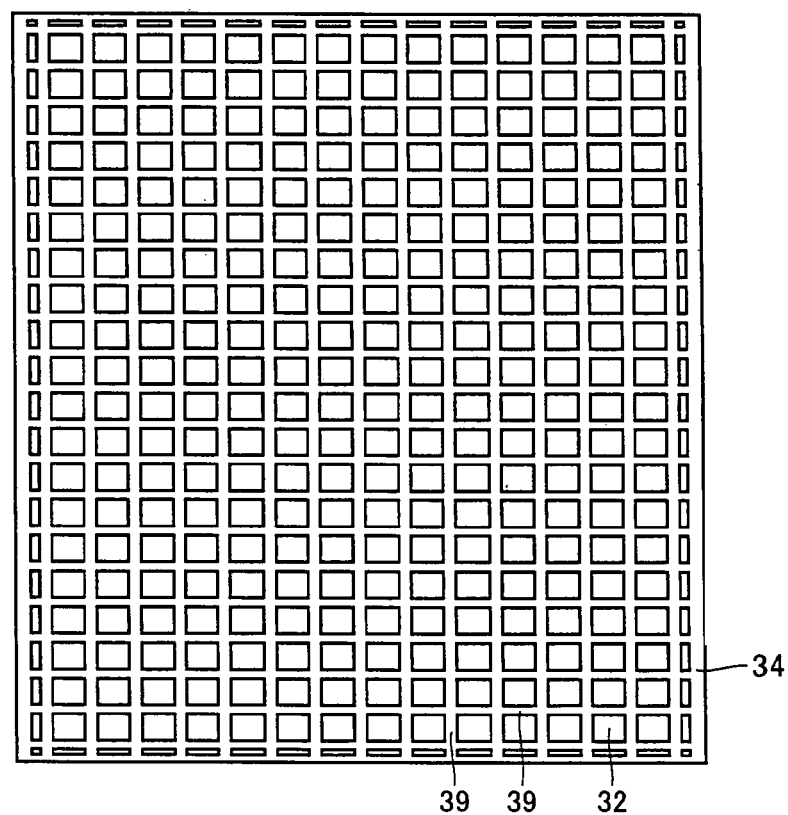
FIG. 20 is a schematic plan showing the optical film having portions removed along liquid crystal display cells.

As shown in FIGS. 18 and 19, the laminated substrate includes two glass substrates opposed and adhered to each other. A plurality of liquid crystal display cells are formed between the two glass substrates. Each of the liquid crystal display cells has a substantially rectangular form in a plan view, and is arranged regularly with respect to the others. Optical films are adhered to main surfaces on the opposite sides of the laminated substrate, respectively. As shown in FIG. 20, the dividing device in this embodiment partially cuts the optical film to remove belt-like portions between the liquid crystal display cells, and thereby provides the optical film of substantially the same form as the liquid crystal display panel. Further, the dividing device forms the cracks for division at the film-removed portion, and divides the panel into the individual liquid crystal display cells.

Figure 1:
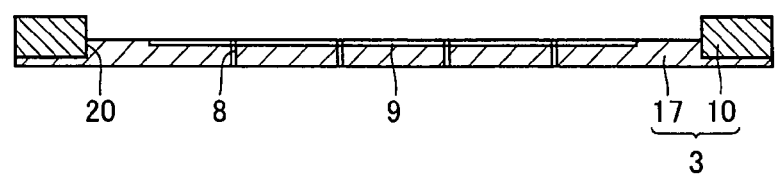
FIG. 1 is a schematic cross section of a stage in a first embodiment.
Figure 2:
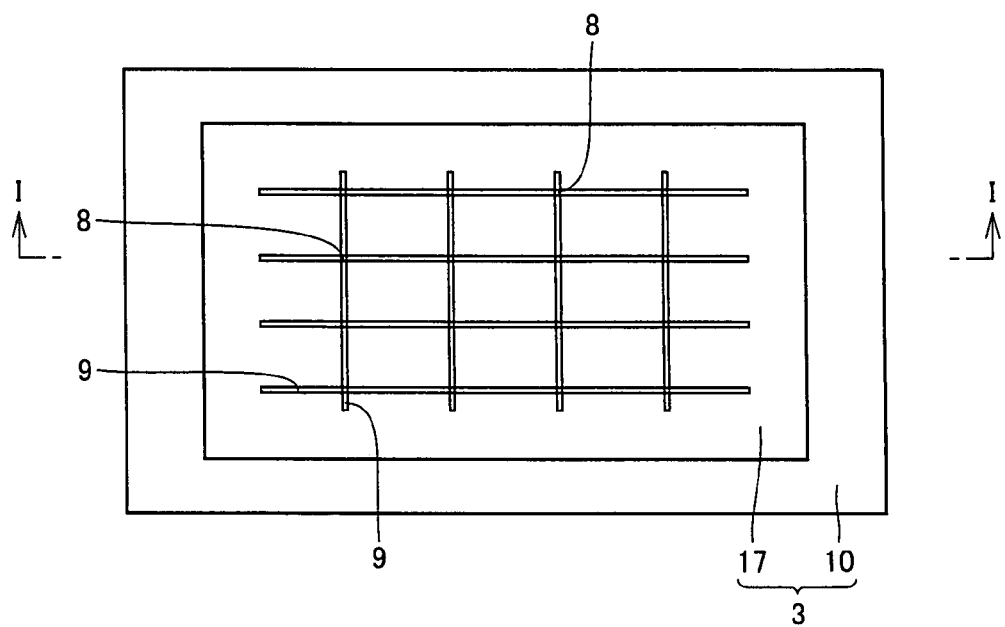
FIG. 2 is a schematic plan of the stage in the first embodiment.

FIG. 1 is a schematic cross section of a portion of a stage of the dividing device in this embodiment, and FIG. 2 is a schematic plan of the stage in FIG. 2. A stage 3 for fixing the laminated substrate has a plate member 17 and an interposition member 10. The laminated substrate which will now be exemplified is provided with liquid crystal display cells of 20 in total number arranged in four rows and five columns, but the invention can be applied to substrates regardless of the number of the liquid crystal display cells.

Plate member 17 has a flat form, and substantially has a rectangular form in a plan view. Plate member 17 has suction holes 8 for suction. Plate member 17 has suction grooves 9 each having a linear form in the plan view and formed at a surface on the side where the laminated substrate is arranged. Suction holes 8 are connected to an evacuation device (not shown).

Suction holes 8 in this embodiment penetrates plate member 17. Suction holes 8 are equally spaced from each other in the plan view. In this embodiment, suction grooves 9 are substantially parallel to outer edges of stage 3. Suction grooves 9 are in a grid-like form in the plan view. Each suction hole 8 is formed at a crossing portion where suction grooves 9 cross together. Suction holes 8 are in communication with suction grooves 9. Suction holes 8 and suction grooves 9 are made in the region where an optical film on the substrate is attached firmly to the stage. On a rear side, i.e., a side remote from a front side of plate member 17 on which the substrate is arranged, suction holes 8 are connected to the evacuation device (not shown).

Stage 3 has interposition member 10 arranged around a region where suction holes 8 are formed. Interposition member 10 provides a projection projecting from the surface of the stage. In this embodiment, interposition member 10 is made of aluminum. Interposition member 10 is fixed to plate member 17 by bolts, and is configured not to allow inflow of the air through a junction between interposition member 10 and plate member 17. Interposition member 10 has a rectangular sectional form, and has a closed frame-like form in the plan view. Suction holes 8 and suction grooves 9 are arranged inside interposition member 10 in the plan view.

Referring to FIG. 1, interposition member 10 is arranged between plate member 17 and the laminated substrate to be arranged. Plate member 17 is provided at the whole of its outer periphery with a recess 20 formed by recessing the surface, and interposition member 10 is arranged in recess 20.

Interposition member 10 is configured such that the surface of interposition member 10 comes into close contact with the surface of the laminated substrate when the laminated substrate is attracted toward stage 3 to bring the surface of the optical film into close contact with the surface of stage 3. In other words, interposition member 10 is configured such that the front surface, i.e., the surface of interposition member 10 on which the laminated substrate is arranged is higher substantially by the thickness of the optical film than the surface of plate member 17 to be in contact with the optical film.

As shown in FIGS. 18 to 20, large optical films are adhered to the opposite sides of the laminated substrate, respectively. Then, one of the optical films adhered to the main surfaces of the laminated substrate is partially cut to remove belt-like portions thereof along the outer peripheries of the liquid crystal display cells formed in the laminated substrate. Then, cracks for division are formed at the film-removed portion.

The other optical film is partially cut and removed in a similar manner, and the cracks for division are formed at the film-removed portion. Then, the substrate is divided into the individual liquid crystal display cells.

In the step of partially removing the optical film on one of the front and rear sides and forming the cracks for division at the film-removed portion, the stage can be sufficiently fixed by suction because the other optical film that is in close contact with the stage has a flat surface (see FIG. 19).

Figure 3:
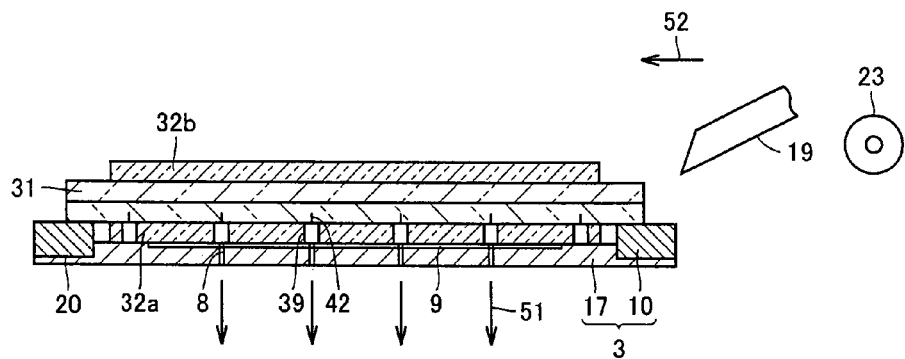
FIG. 3 is a schematic cross section of a laminated substrate fixed to the stage in the first embodiment.
Figure 4:
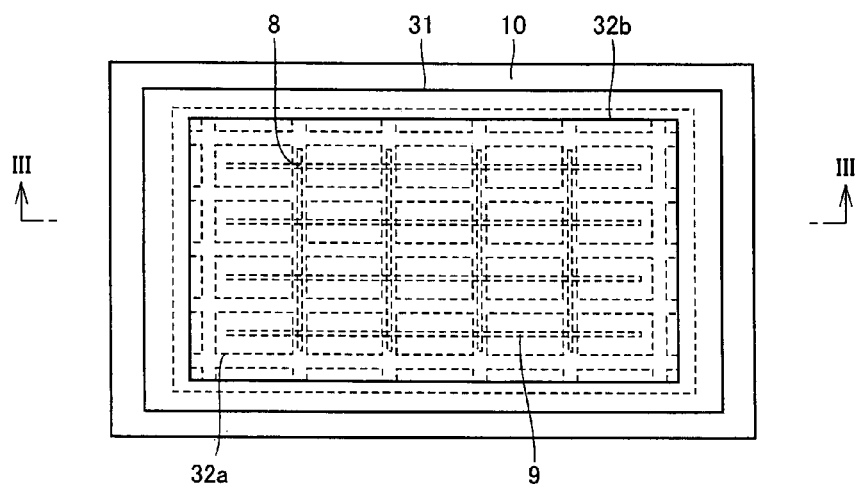
FIG. 4 is a schematic plan of the laminated substrate fixed to the stage in the first embodiment.

FIG. 3 is a schematic cross section of the laminated substrate fixed to the stage, and FIG. 4 is a schematic plan of the laminated substrate fixed to the stage. Particularly, FIG. 3 is the schematic cross section of the structure in which film-removed portion 39 is formed by partially cutting an optical film 32a on one side out of the front and read side, and removing belt-like portions, and an optical film 32b on the other side will be partially cut and removed for forming the cracks for division.

After optical film 32a is processed to form film-removed portion 39, and cracks 42 for division at film-removed portion 39, a laminated substrate 31 is turned over and arranged to bring optical film 32a into contact with plate member 17 of stage 3. For example, laminated substrate 31 is turned over with optical film 32a of laminated substrate 31 attracted onto the plate member (not shown), and then laminated substrate 31 is moved onto stage 3 with optical film 32b attracted onto another plate member (not shown). Positioning of laminated substrate 31 on stage 3 is performed. For example, positioning laminated substrate 31 is performed with positioning pins (not shown) while floating laminated substrate 31 by an air supplied from suction holes 8.

Then, the evacuation device (not shown) is driven to attract laminated substrate 31 through suction holes 8 as indicated by arrows 51. As shown in FIG. 3, after fixing laminated substrate 31 to stage 3 by suction, a blade 19 is horizontally moved in a direction of an arrow 52 and a direction perpendicular to arrow 52, and thereby belt-like portions are partially cut and removed from optical film 32b. Further, a wheel cutter 23 is horizontally moved in the portion where optical film 32b is removed, and thereby forms cracks for division. The above operations effected on the portion between the neighboring liquid crystal display cells are repeated in the row and column directions to divide laminated substrate 31 into the individual liquid crystal display cells.

Figure 5:
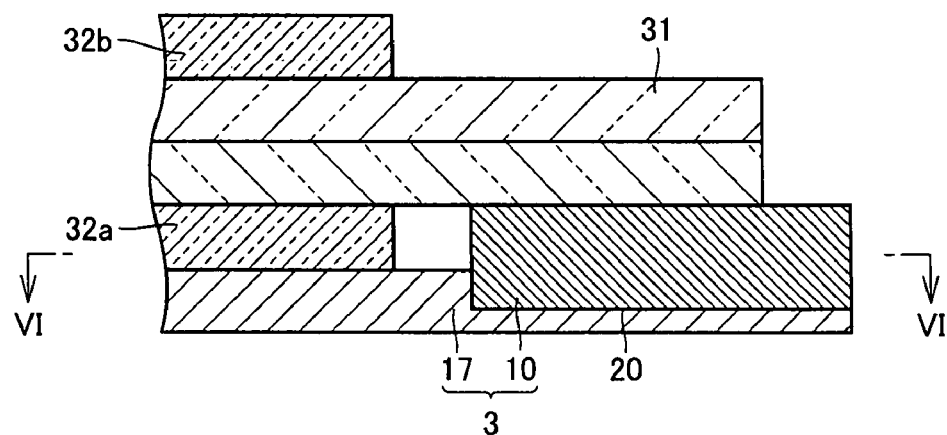
FIG. 5 is a first schematic cross section of an outer peripheral portion of the laminated substrate arranged on the stage in the first embodiment.
Figure 6:
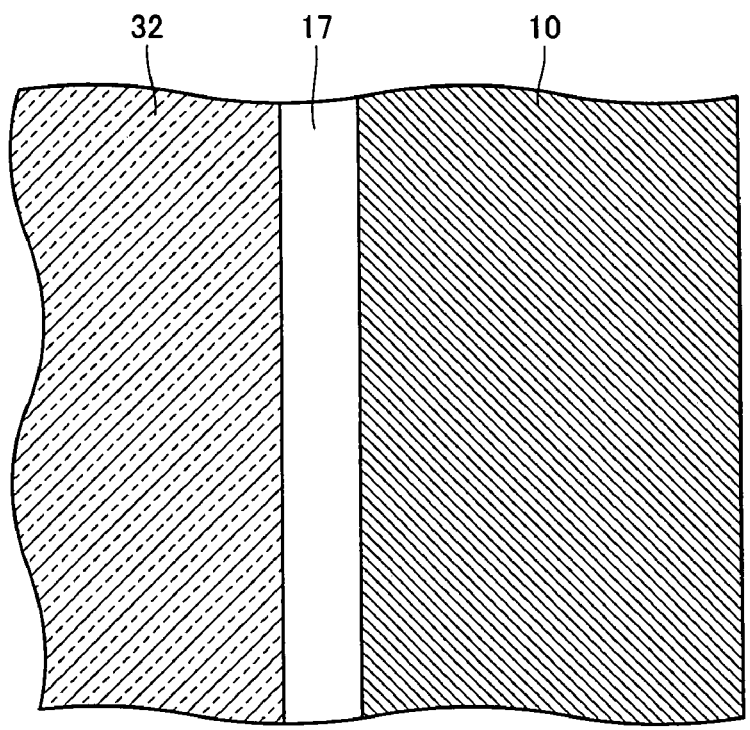
FIG. 6 is a second schematic cross section of the outer peripheral portion of the laminated substrate arranged on the stage in the first embodiment.
Figure 7:
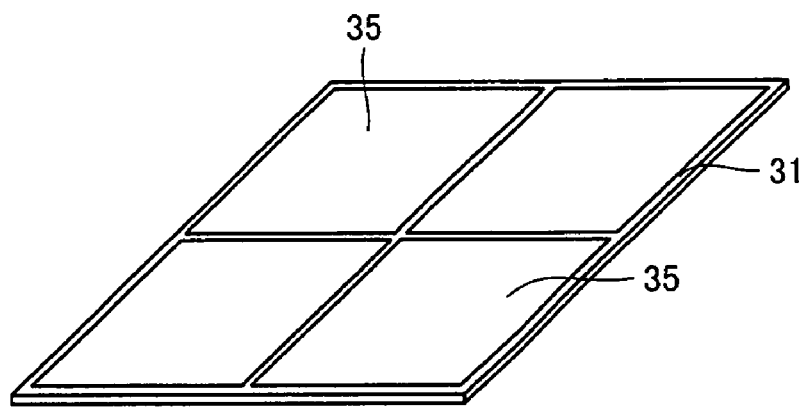
FIG. 7 is a perspective view of the substrate and optical films of another form adhered thereto in the first embodiment.

FIG. 5 is a schematic cross section showing, on an enlarged scale, structures including the interposition member during fixing by suction. FIG. 6 is a cross section taken along line VI-VI in FIG. 5. When the surface of optical film 32a is brought into close contact with the surface of plate member 17 of stage 3 by the suction, the surface of laminated substrate 31 comes into contact with the surface of interposition member 10. The close contact of laminated substrate 31 with interposition member 10 forms a sealing portion.

Referring to FIGS. 3 and 4, interposition member 10 is arranged around the region of stage 3 where suction holes 8 are formed, and has a closed frame-like form. Therefore, the space defined by laminated substrate 31, interposition member 10 and plate member 17 is a closed space connected to the evacuation device, and inflow of the air is prevented. Consequently, laminated substrate 31 can be stably fixed to stage 3 by suction. More specifically, it is possible to prevent the air from flowing into suction holes 8 in stage 3 through film-removed portion 39 formed at optical film 32a and suction grooves 9, and it is possible to fix stably laminated substrate 31 to stage 3 by suction.

Interposition member 10 has a flat surface parallel to the surface of stage 3, and has a height achieving such a state that the surface interposition member 10 comes into close contact with the surface of laminated substrate 31 when laminated substrate 31 is attracted onto stage 3 to bring the surface of optical film 32a into close contact with plate member 17 of stage 3. Thereby, the contact area between the surface of interposition member 10 and the surface of laminated substrate 31 can be large, and the air inflow can be prevented more reliably. Further, curvature of laminated substrate 31 can be prevented when laminated substrate 31 is fixed to stage 3 by suction. For example, laminated substrate 31 can be fixed horizontally when partially cutting and removing optical film 32 so that optical film 32 can be cut and removed reliably. Further, the division with wheel cutter 23 can be performed reliably.

Figure 21:
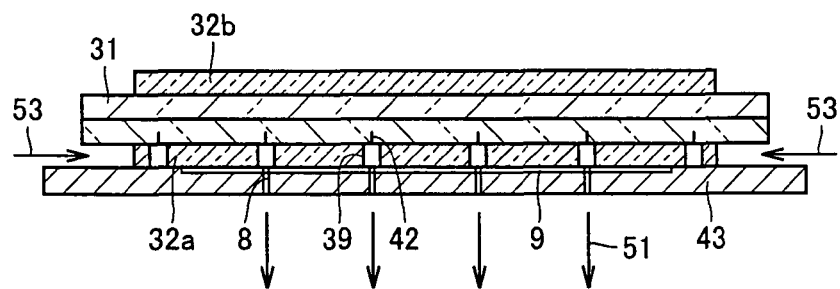
FIG. 21 is a schematic cross section of a liquid crystal display panel manufacturing apparatus of the prior art, and shows a laminated substrate arranged on a stage.
Figure 22:
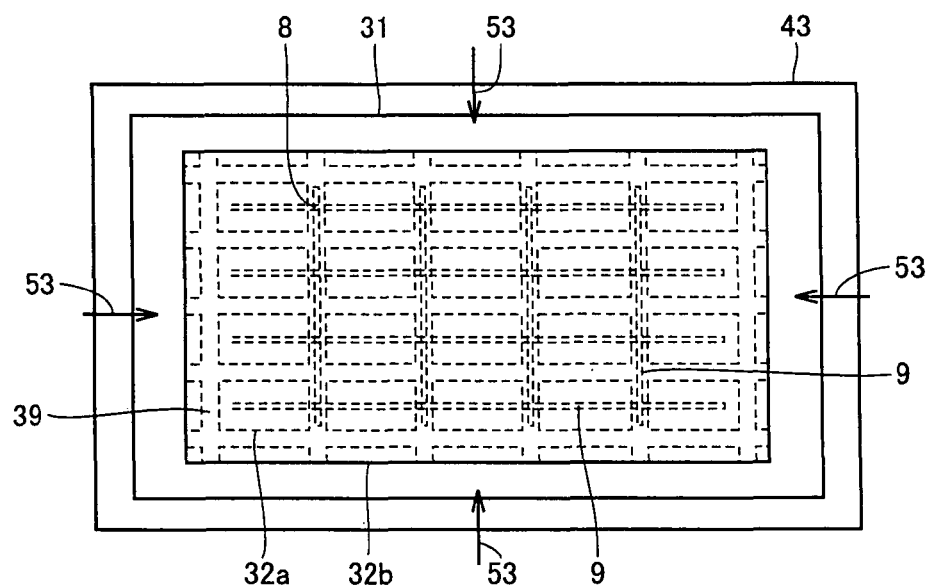
FIG. 22 is a schematic plan of the liquid crystal display panel manufacturing apparatus of the prior art, and shows the laminated substrate arranged on the stage.

The apparatus of manufacturing the liquid crystal display panel of this embodiment was produced, and this apparatus could sufficiently fix the laminated substrate by suction owing to arrangement of the interposition member in the recess formed at the stage, although the conventional manufacturing apparatus shown in FIGS. 21 and 22 could not sufficiently fix the laminated substrate to the stage by suction.

In this embodiment, the stage has the plate member, and has the interposition member that is formed as the projection of the stage to be held between the plate member and the substrate. Owing to employment of this structure, the substrates of various thicknesses and sizes can be fixed only by changing the interposition member. However, the projection of the stage is not restricted to the above form, and the plate member and the projection may be integrally formed of a single member.

Although the interposition member is made of aluminum in this embodiment, this is not restrictive, and the interposition member may be made of another material that can prevent the air inflow through a space between the substrate and the interposition member. For example, the interposition member may be made of vinyl chloride.

In this embodiment, the interposition member has a substantially rectangular cross section. Employment of this structure can increase the contact area between the interposition member and the substrate, and can prevent the air inflow more reliably. The interposition member may have any sectional form other than the rectangle. However, it is preferable to employ the interposition member of the rectangular form or the like that provides a flat portion parallel to the stage for carrying the substrate thereon, because this structure can prevent curvature of the substrate.

The suction holes formed in the stage may be located at arbitrary positions inside the projection of the stage, and the suction grooves located inside the stage may have arbitrary forms. For example, the suction grooves may have a radial form, and the suction holes equally spaced from each other may be formed along the suction grooves.

This embodiment has been described in connection with the dividing device, in which the optical film arranged on the substrate surface is partially cut and removed, then the cracks for division are formed at the film-removed portion for division and the substrate is divided into the individual liquid crystal display cells. However, the embodiment is not restricted to the device that performs both the processing of cutting and removing the optical film and the processing of forming the cracks, and may be applied, for example, to an optical film removing device that partially cuts and removes the optical film arranged on the substrate surface as well as a dividing device that merely forms cracks on the substrate surface.

The embodiment can be applied to devices other than the device already described provided that the suction holes or the suction grooves are in communication with the end side of the optical film in the plan view. For example, the embodiment can be applied to a device shown in FIG. 7. In this device, laminated substrate 31 has a plurality of relatively small optical films 35 adhered to one of its surface, and optical films 35 are attracted to the stage by suction for fixing and processing laminated substrate 31. This device can likewise prevent inflow of an ambient air through a portion where the optical film is not arranged when the substrate is attracted to the stage by suction, and therefore can stably fix the substrate by suction.

Figure 8:
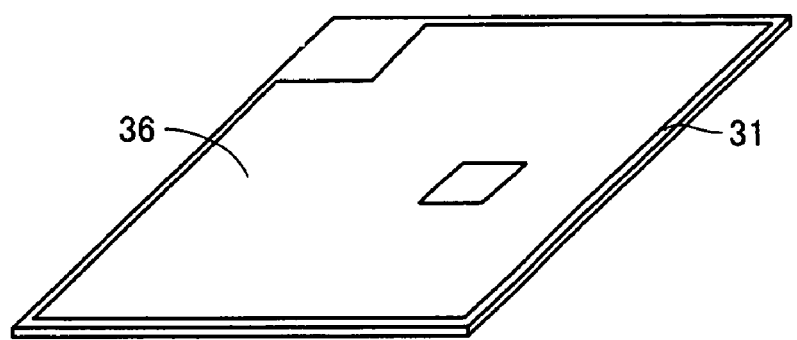
FIG. 8 is a perspective view of the substrate and optical films of still another form adhered thereto in the first embodiment.

The embodiment can be applied to a device shown in FIG. 8. In this device, an optical film 36 that is partially cut and removed is adhered to at least one of surfaces of laminated substrate 31, and optical film 36 is fixed to the stage by suction for processing laminated substrate 31. When the substrate is subjected to the suction, this structure can likewise prevent inflow of an ambient air through a portion from which the optical film is removed, and therefore can stably fix the substrate by suction.

The substrate is not restricted to the laminated substrate for the liquid crystal display panel, and the display panel manufacturing apparatus of this embodiment can be used for various substrates having the optical films adhered thereto. For example, the display panel manufacturing apparatus of this embodiment can likewise be used for manufacturing the organic EL display panel having the optical film.

Second Embodiment

Figure 9:
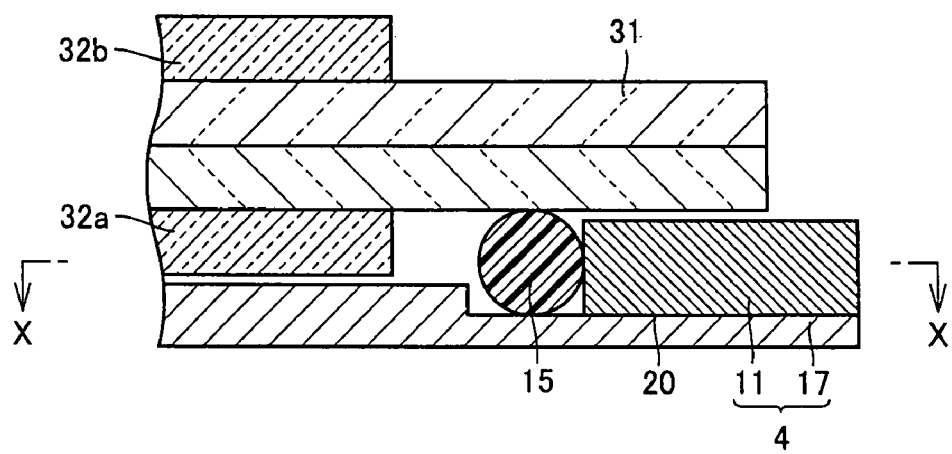
FIG. 9 is a first schematic cross section of an outer peripheral portion of a laminated substrate arranged on a stage in a second embodiment.
Figure 10:
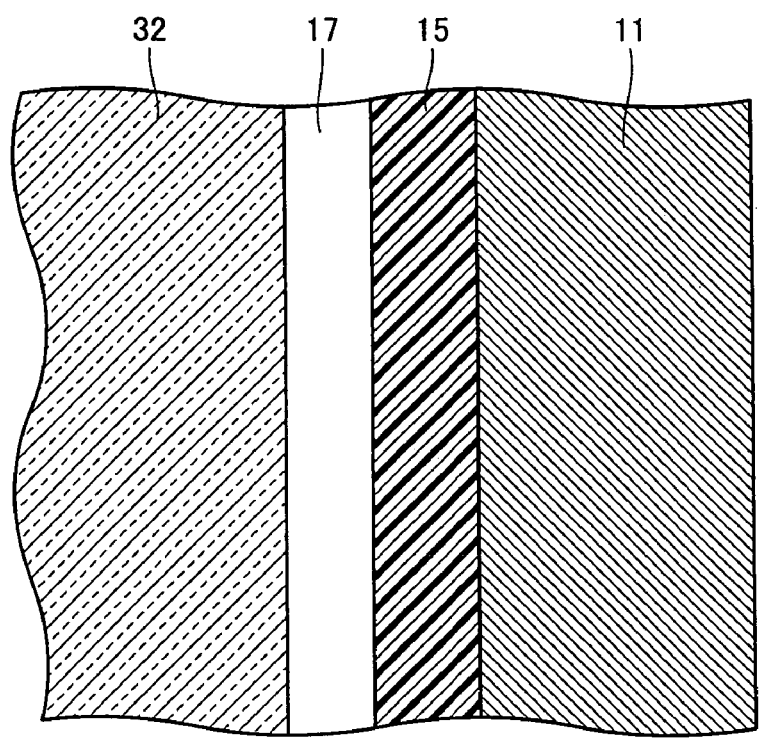
FIG. 10 is a second schematic cross section of the outer peripheral portion of the laminated substrate arranged on the stage in the second embodiment.
Figure 11:
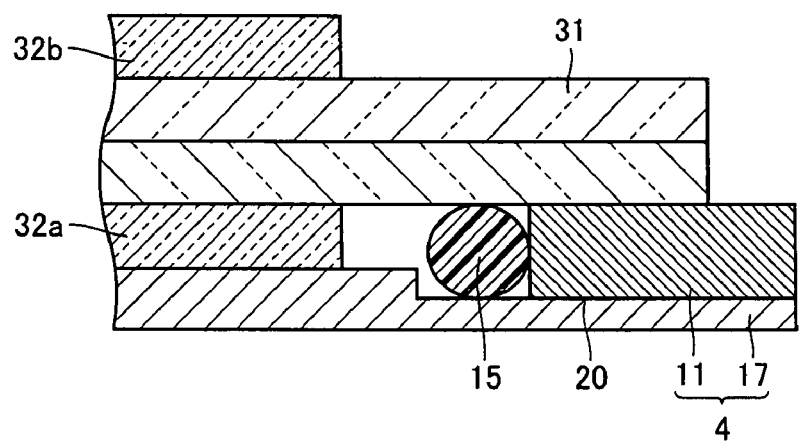
FIG. 11 is a schematic cross section of the outer peripheral portion of the laminated substrate fixed to the stage in the second embodiment.

Referring to FIGS. 9 to 11, description will now be given on an apparatus and a method of manufacturing a liquid crystal display panel according to a second embodiment of the invention. The apparatus of manufacturing the liquid crystal display panel according to the embodiment is a dividing device, by which an optical film arranged on a surface of a laminated substrate is partially cut and removed, then cracks for division are formed at a film-removed portion and division into individual liquid crystal display cells is performed. A stage is provided with a suction hole and a suction groove, and the suction hole is connected to an evacuation device. These structures are the same as those in the first embodiment.

FIG. 9 is a schematic cross section showing, on an enlarged scale, an outer peripheral portion of the stage on which the substrate is arranged but is not yet fixed by suction. FIG. 10 is a cross section taken along line X-X in FIG. 9. A stage 4 in this embodiment includes plate member 17 and an interposition member 11. Plate member 17 is provided at the whole of its outer periphery with recess 20.

Interposition member 11 and a packing 15 are arranged on the surface of recess 20. Interposition member 11 has a smaller horizontal size than recess 20 so that packing 15 can be arranged. Interposition member 11 has a substantially rectangular cross section. Interposition member 11 has a frame-like form in a plan view. Interposition member 11 is held between plate member 17 and laminated substrate 31 to be fixed.

Packing 15 has a circular cross section. Packing 15 has a linear form in the plan view. Packing 15 has elasticity. In this embodiment, packing 15 is made of silicon rubber. Packing 15 is held between plate member 17 and laminated substrate 31. Packing 15 is located inside interposition member 11 and between interposition member 11 and a stepped portion formed at the inner edge of recess 20 in the plan view. Packing 15 is arranged along interposition member 11. Packing 15 has a frame-like form. Packing 15 surrounds a region where the suction holes and the suction grooves are formed.

Interposition member 11 has a height that can bring the surface of interposition member 11 into close contact with the surface of laminated substrate 31 when laminated substrate 31 is attracted toward stage 4 by suction, and thereby the surface of optical film 32a comes into close contact with the surface of stage 4.

Packing 15 has a portion that comes into contact with the substrate earlier than the other portions (and will be referred to as a "top" hereinafter) when the stage is being arranged. Packing 15 is configured such that this top is higher than the surface of interposition member 11 in an unloaded state, i.e., when the substrate is not arranged. More specifically, packing 15 is configured such that the top of packing 15 is located at the same height as the surface of interposition member 11 when the substrate is arranged, or such that the top of packing 15 is located higher than the surface of interposition member 11 when laminated substrate 31 is not attracted by suction. In the former configuration, packing 15 is compressed to locate its top at the same height as the surface of interposition member 11 when the substrate is arranged. In the latter configuration, packing 15 is compressed to locate its top at the same height as the surface of interposition member 11 when laminated substrate 31 is attracted by suction. Based on the latter configuration, operations and effects will now be described.

In this embodiment, the packing is arranged inside the interposition member, but this is not restrictive, and the packing may be arranged outside the interposition member. In this case, the recess and interposition member are formed such that the packing can be arranged for contact with the laminated substrate.

Other structures are the same as those in the first embodiment, and description thereof is not repeated. The various modifications already described in connection with the first embodiment can likewise be applied to this embodiment.

In the dividing device according to the embodiment, the evacuation device is driven to attract the laminated substrate by suction via the suction holes and suction grooves formed at the stage, and thereby the laminated substrate is fixed to the stage. These operations are the same as those in the first embodiment.

FIG. 11 is a schematic cross section of an end of the stage to which the laminated substrate is fixed by suction. When the suction starts, laminated substrate 31 is attracted toward stage 4. Packing 15 is compressed between plate member 17 and laminated substrate 31.

Optical film 32a comes into close contact with plate member 17, and laminated substrate 31 comes into close contact with the surface of interposition member 11. In the apparatus of manufacturing the liquid crystal display panel according to the embodiment, the close contact between interposition member 11 and laminated substrate 31 forms a first sealing portion. Further, the close contact of packing 15 with plate member 17 and laminated substrate 31 forms a second sealing portion. In this manner, this embodiment can prevent the air inflow by the double sealing portions, and can fix the laminated substrate more firmly by suction.

In this embodiment, the packing has a circular cross section, but may have a cross section of any another form provided that the packing has a function of preventing the air inflow.

The apparatus of manufacturing the liquid crystal display panel according to the embodiment was practically formed, and a performance test was conducted. Packing 15 had such a size that the top was higher by about 100 microns than the surface of interposition member 11 in the unloaded state. Packing 15 was made of silicon rubber, and interposition member 11 was made of aluminum. The performance test was also conducted on a dividing device that had packing 15 arranged outside interposition member 11, in addition to the dividing device that had packing 15 arranged inside interposition member 11.

From the performance tests, it was confirmed that both the dividing device having the packing inside the interposition member and the dividing device having the packing outside the interposition member could sufficiently fix by suction the laminated substrates, respectively, that were not sufficiently fixed by suction in the prior art due to air inflow.

Other operations and effects are the same as those of the first embodiment, and description thereof is not repeated.

Third Embodiment

Figure 12:
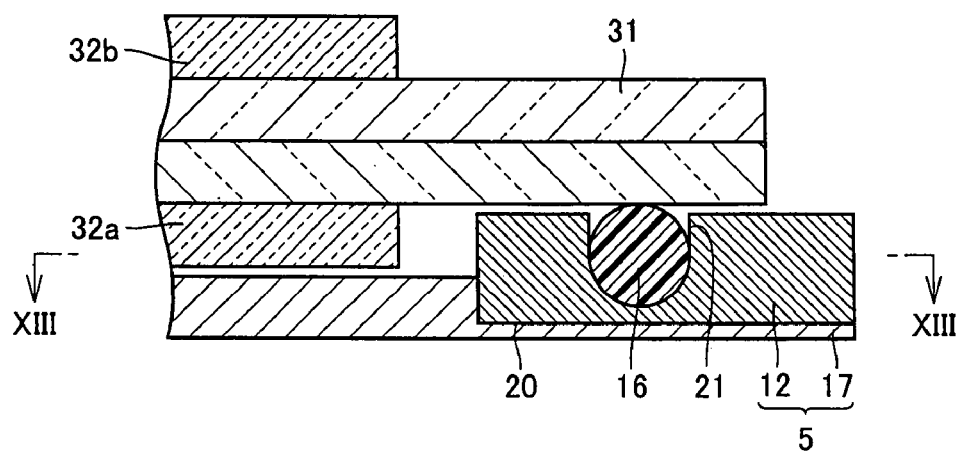
FIG. 12 is a first schematic cross section of an outer peripheral portion of a laminated substrate arranged on a stage in a third embodiment.
Figure 13:
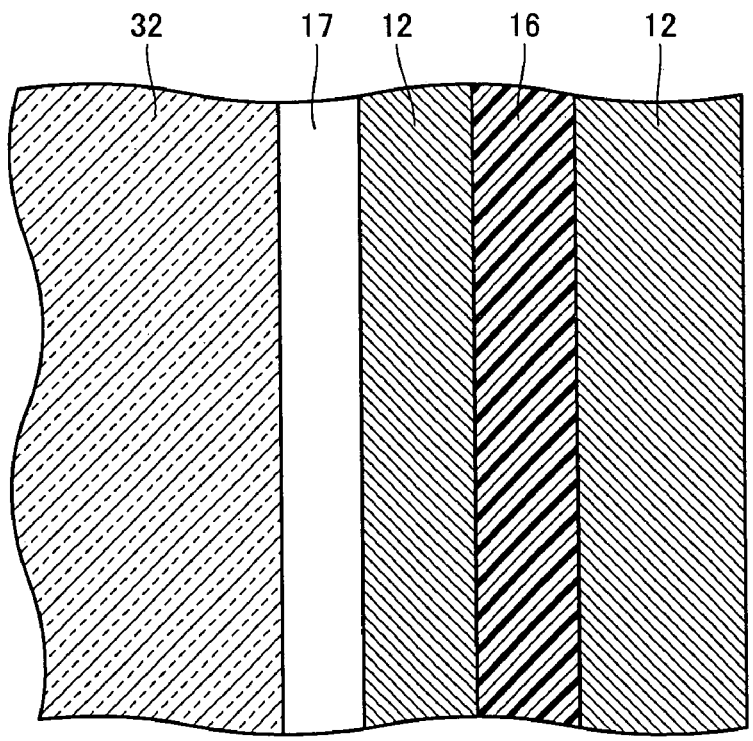
FIG. 13 is a second schematic cross section of the outer peripheral portion of the laminated substrate arranged on the stage in the third embodiment.
Figure 14:
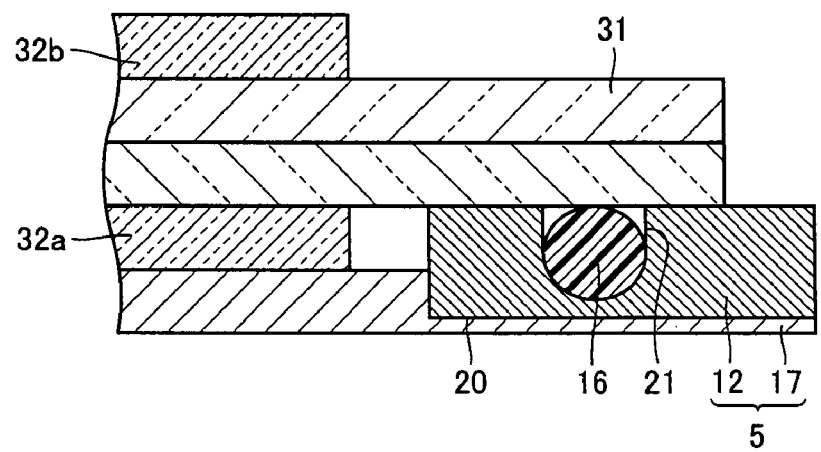
FIG. 14 is a schematic cross section of the outer peripheral portion of the laminated substrate fixed to the stage in the third embodiment.

Referring to FIGS. 12 to 14, description will now be given on an apparatus and a method of manufacturing a liquid crystal display panel according to a third embodiment of the invention. The apparatus of manufacturing the liquid crystal display panel according to the embodiment is a dividing device, by which an optical film arranged on a surface of a laminated substrate is partially cut and removed, then cracks for division are formed and division into individual liquid crystal display cells is performed. A stage is provided with a suction hole and a suction groove, and the suction hole is connected to an evacuation device. These structures are the same as those in the first embodiment.

FIG. 12 is a schematic cross section of an outer peripheral portion of the stage on which the laminated substrate is arranged but is not yet fixed by suction. FIG. 13 is a cross section taken along line XIII-XIII in FIG. 12. A stage 5 in this embodiment includes plate member 17 and an interposition member 12. Plate member 17 is provided at the whole of its outer periphery with recess 20.

Interposition member 12 and a packing 16 are arranged on the surface of recess 20. Interposition member 12 has a substantially rectangular section. Interposition member 12 has a frame-like form in a plan view. Interposition member 12 is held between plate member 17 and laminated substrate 31 to be fixed.

Interposition member 12 includes a concave portion 21 formed at a region to be in contact with the substrate. Concave portion 21 has a linear form in the plan view. Concave portion 21 extends in the extension direction of interposition member 12 in the plan view. Packing 16 is arranged in concave portion 21. Packing 16 has a circular cross section. In the plan view, packing 16 has a linear and frame-like form. Concave portion 21 has a bottom of a semicircular cross section that is corresponding to the circle of the cross section of packing 16.

Interposition member 12 has a height that can bring the surface of interposition member 12 into close contact with the surface of laminated substrate 31 when laminated substrate 31 is attracted toward stage 5 by suction, and thereby the surface of optical film 32a comes into close contact with the surface of stage 5.

Packing 16 is configured such that the top of packing 16 is higher than the surface of interposition member 12 provided with concave portion 21 in the unloaded state, i.e., when the substrate is not arranged. More specifically, packing 16 is configured such that the top of packing 16 is located at the same height as the surface of interposition member 12 when the substrate is arranged, or such that the top of packing 16 is located higher than the surface of interposition member 12 when laminated substrate 31 is not attracted by suction. In the former configuration, packing 16 is compressed to locate its top at the same height as the surface of interposition member 12 when the substrate is arranged. In the latter configuration, packing 16 is compressed to locate its top at the same height as the surface of interposition member 12 when laminated substrate 31 is attracted by suction. Based on the latter configuration, operations and effects will now be described.

Other structures are the same as those in the first embodiment, and description thereof is not repeated. The various modifications already described in connection with the first embodiment can likewise be applied to this embodiment.

In the dividing device according to the embodiment, the evacuation device is driven to attract the laminated substrate by suction via the suction holes and suction grooves formed at the stage, and thereby the laminated substrate is fixed to the stage. These operations are the same as those in the first embodiment.

FIG. 14 is a schematic cross section of an end of the stage to which the laminated substrate is fixed by suction. When the evacuation device performs the suction, laminated substrate 31 is attracted toward a stage 6. Packing 16 is compressed and brought into close contact with concave portion 21 and laminated substrate 31. Optical film 32a comes into close contact with the surface of plate member 17, and the surface of laminated substrate 31 comes into close contact with the surface of interposition member 12.

In the apparatus of manufacturing the liquid crystal display panel according to the embodiment, the close contact between interposition member 12 and laminated substrate 31 forms a first sealing portion. Further, the close contact of packing 16 with concave portion 21 and laminated substrate 31 forms a second sealing portion. In this manner, this embodiment can prevent the air inflow by the double sealing portions, and can fix the laminated substrate more firmly by suction.

In this embodiment, the packing has a circular section, but may have a section of any another form provided that the packing has a function of preventing the air inflow. The bottom of the concave portion preferably has a form corresponding to the form of the packing. Employment of this structure can increase the contact area between the concave portion and the packing, and can prevent the air inflow more reliably.

The apparatus of manufacturing the liquid crystal display panel according to the embodiment was practically formed, and a performance test was conducted. Interposition member 12 was made of aluminum, and packing 16 was made of silicon rubber. Packing 16 had such a size that the top was higher by about 100 microns than the surface of interposition member 12 in the unloaded state. From the performance test, it was confirmed that the dividing device could sufficiently fix by suction the laminated substrate that was not sufficiently fixed by suction in the prior art due to air inflow.

Other operations and effects are the same as those of the first embodiment, and description thereof is not repeated.

Fourth Embodiment

Figure 15:
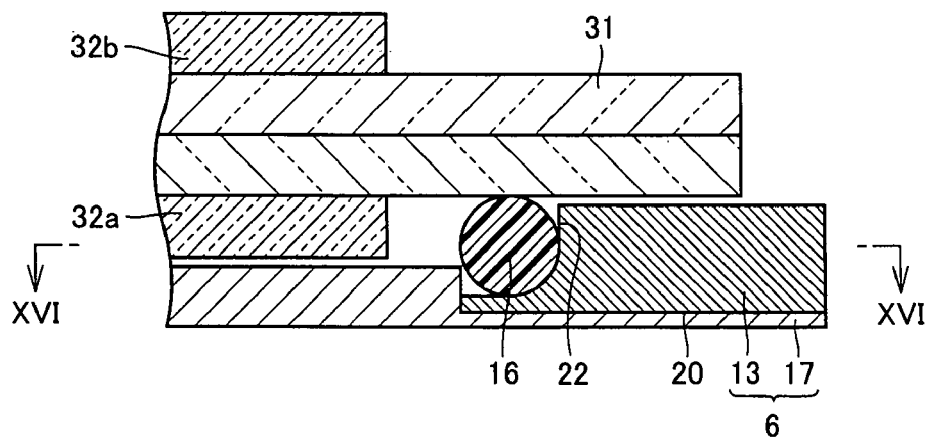
FIG. 15 is a first schematic cross section of an outer peripheral portion of a laminated substrate arranged on a stage in a fourth embodiment.
Figure 16:
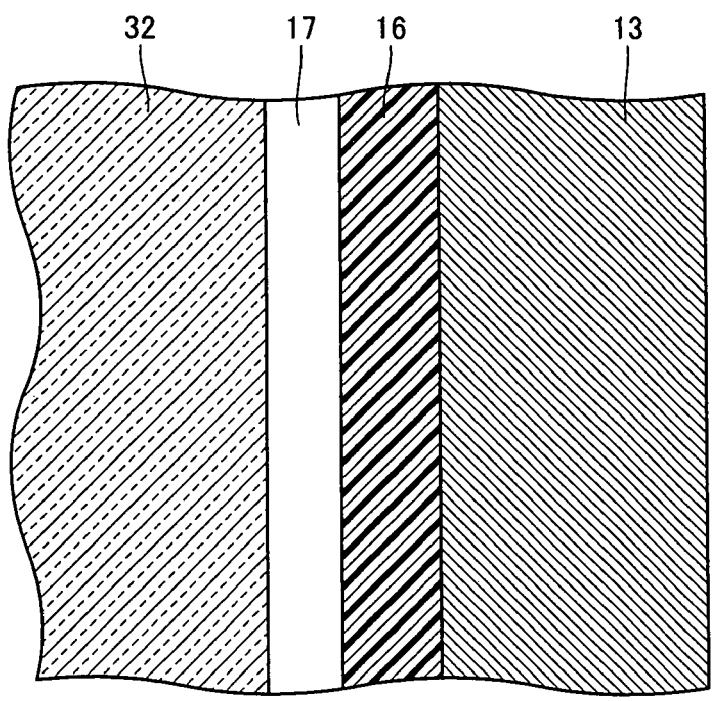
FIG. 16 is a second schematic cross section of the outer peripheral portion of the laminated substrate arranged on the stage in the fourth embodiment.
Figure 17:
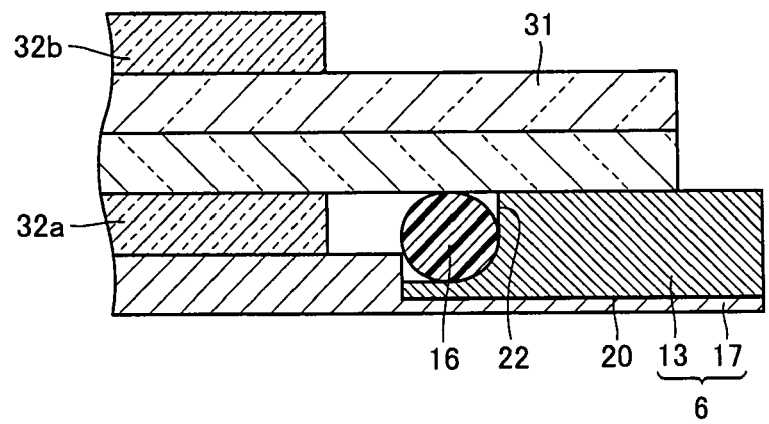
FIG. 17 is a schematic cross section of the outer peripheral portion of the laminated substrate fixed to the stage in the fourth embodiment.

Referring to FIGS. 15 to 17, description will now be given on an apparatus of manufacturing a liquid crystal display panel according to a fourth embodiment of the invention. The apparatus of manufacturing the liquid crystal display panel according to the embodiment is a dividing device, by which an optical film arranged on a surface of a laminated substrate is partially cut and removed, then cracks for division are formed and division into individual liquid crystal display cells is performed. A stage is provided with a suction hole and a suction groove, and the suction hole is connected to an evacuation device. These structures are the same as those in the first embodiment.

FIG. 15 is a schematic cross section of an outer peripheral portion of the stage on which the laminated substrate is arranged but is not yet fixed by suction. FIG. 16 is a cross section taken along line XVI-XVI in FIG. 15. Stage 6 in this embodiment includes plate member 17 and an interposition member 13. Plate member 17 is provided at the whole of its outer periphery with recess 20.

Interposition member 13 is arranged on the surface of recess 20. Interposition member 13 has a substantially rectangular cross section. A concave portion 22 is formed at one of the four corners of this substantially rectangular cross section. Interposition member 13 has a frame-like form in a plan view. Interposition member 13 is held between plate member 17 and laminated substrate 31 to be fixed.

Concave portion 22 is formed inside interposition member 13. Packing 16 is arranged in concave portion 22. Packing 16 has a circular section. Concave portion 22 has a portion of an arc-shaped cross section that is corresponding to the circle of the section of packing 16. In a plan view, each of concave portion 22 and packing 16 has a linear and frame-like form.

Interposition member 13 has a height that can bring the surface of interposition member 13 into close contact with the surface of laminated substrate 31 when laminated substrate 31 is attracted toward stage 6 by suction, and thereby the surface of optical film 32a comes into close contact with the surface of stage 6.

Packing 16 is configured such that the top of packing 16 is higher than the surface of interposition member 13 provided with concave portion 22 in the unloaded state, i.e., when the substrate is not arranged. More specifically, packing 16 is configured such that the top of packing 16 is located at the same height as the surface of interposition member 13 when the substrate is arranged, or such that the top of packing 16 is located higher than the surface of interposition member 13 when laminated substrate 31 is not attracted by suction. In the former configuration, packing 16 is compressed to locate its top at the same height as the surface of interposition member 13 when the substrate is arranged. In the latter configuration, packing 16 is compressed to locate its top at the same height as the surface of interposition member 13 when laminated substrate 31 is attracted by suction. Based on the latter configuration, operations and effects will now be described.

Although concave portion 22 in this embodiment is formed at the inner side of interposition member 13, it may be formed at the outer side of interposition member 13.

Other structures are the same as those in the first embodiment, and description thereof is not repeated. The various modifications already described in connection with the first embodiment can likewise be applied to this embodiment.

In the dividing device according to the embodiment, the evacuation device is driven to attract the laminated substrate by suction via the suction holes and suction grooves formed at the stage, and thereby the laminated substrate is fixed to the stage. These operations are the same as those in the first embodiment.

FIG. 17 is a schematic cross section of an end of the stage to which the laminated substrate is fixed by suction. When the evacuation device performs the suction, laminated substrate 31 is attracted toward stage 6. Packing 16 is compressed and brought into close contact with concave portion 22 and laminated substrate 31. Optical film 32a comes into close contact with plate member 17 of stage 6, and the surface of laminated substrate 31 comes into close contact with the surface of interposition member 13.

In the apparatus of manufacturing the liquid crystal display panel according to the embodiment, the close contact between interposition member 13 and laminated substrate 31 forms a first sealing portion. Further, the close contact of packing 16 with concave portion 22 and laminated substrate 31 forms a second sealing portion. In this manner, this embodiment can prevent the air inflow by the double sealing portions, and can fix the laminated substrate more firmly by suction.

In this embodiment, the packing has a circular section, but may have a section of any another form provided that the packing has a function of preventing the air inflow. The bottom of the concave portion preferably has a form corresponding to the form of the packing. Employment of this structure can increase the contact area between the concave portion and the packing, and can prevent the air inflow more reliably.

A performance test was conducted with the apparatus of manufacturing the liquid crystal display panel according to the embodiment. Interposition member 13 was made of aluminum, and packing 16 was made of silicon rubber. Packing 16 had such a size that the top was higher by about 100 microns than the surface of interposition member 13 in the unloaded state. The performance test was also conducted on a dividing device that had the packing arranged outside the interposition member. From the performance tests, it was confirmed that both the dividing device having the packing inside the interposition member and the dividing device having the packing outside the interposition member could sufficiently fix by suction the laminated substrates, respectively, that were not sufficiently fixed by suction in the prior art.

Other operations and effects are the same as those of the first embodiment, and description thereof is not repeated.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

The invention can be effectively applied to the manufacturing of the display panel.

The invention claimed is:

1. A display panel manufacturing apparatus comprising:
    a stage for fixing a substrate having an optical film adhered to at least one surface of said substrate, wherein
    said stage has a suction hole for attracting said substrate by suction,
    said stage includes a projection around a region provided with said suction hole,
    said projection has a closed frame-like form in a plan view, and
    wherein
       said stage includes a plate member, and
       said projection has an interposition member to be held between said plate member and said substrate.

2. The display panel manufacturing apparatus according to claim 1, wherein
    said projection has a height allowing the surface of said projection to closely contact with the surface of said substrate when said substrate is attracted by suction so as to bring the surface of said optical film into close contact with the surface of said stage.

3. The display panel manufacturing apparatus according to claim 2, wherein
    said projection has a flat surface, and
    said surface of said projection is parallel to a surface of said stage.

4. The display panel manufacturing apparatus according to claim 1, further comprising:
an elastic packing, wherein
said packing is held between said stage and said substrate,
said packing is arranged along said projection and around a region provided with said suction hole, and
said packing in an unloaded state has a top located above the surface of said projection.

5. The display panel manufacturing apparatus according to claim 4, wherein
said packing deforms to locate the top at the same height as the surface of said projection when said substrate is attracted by suction.

6. The display panel manufacturing apparatus according to claim 1, further comprising:
an elastic packing, wherein
said projection has a concavity formed at a surface on a side to be in contact with said substrate,
said packing is arranged in said concavity,
said packing in an unloaded state has a top located above the surface of said projection provided with said concavity.

7. The display panel manufacturing apparatus according to claim 6, wherein
said packing deforms to locate the top at the same height as the surface of said projection when said substrate is attracted by suction.

8. A display panel manufacturing method using a display panel manufacturing apparatus including;
a stage for fixing a substrate having an optical film adhered to at least one of surface of said substrate,
said stage having a suction hole for attracting said substrate,
said stage including a projection around a region provided with said suction hole, and
said stage including a plate member, and
said projection having a closed frame-like form in a plan view; and
said projection having an interposition member to be held between said plate member and said substrate,
said display panel manufacturing method comprising the steps of:
arranging said optical film to oppose to said stage; and
attracting said substrate by suction via said suction hole to form a closed space by bringing a surface of said projection into close contact with a surface of said substrate, and attracting the surface of said optical film to the surface of the stage by suction.

\* \* \* \* \*